United States Patent
Yang et al.

(10) Patent No.: US 9,401,292 B2
(45) Date of Patent: Jul. 26, 2016

(54) TRANSPORTING DEVICE FOR SUBSTRATE OF LIQUID CRYSTAL DISPLAY AND USING METHOD THEREOF

(71) Applicant: SHENZHEN CHINA STAR OPTOELECTRONICS TECHNOLOGY CO., LTD., Shenzhen, Guangdong (CN)

(72) Inventors: Weibing Yang, Guangdong (CN); Chun Hao Wu, Guangdong (CN); Kun Hsien Lin, Guangdong (CN); Yongqiang Wang, Guangdong (CN); Zhiyou Shu, Guangdong (CN); Minghu Qi, Guangdong (CN); Zenghong Chen, Guangdong (CN); Guokun Yang, Guangdong (CN); Yunshao Jiang, Guangdong (CN); Chenyangzi Li, Guangdong (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 172 days.

(21) Appl. No.: 14/113,818

(22) PCT Filed: Jun. 25, 2013

(86) PCT No.: PCT/CN2013/077886
§ 371 (c)(1),
(2) Date: Oct. 25, 2013

(87) PCT Pub. No.: WO2014/187001
PCT Pub. Date: Nov. 27, 2014

(65) Prior Publication Data
US 2014/0350712 A1 Nov. 27, 2014

(30) Foreign Application Priority Data

May 21, 2013 (CN) .......................... 2013 1 0190657

(51) Int. Cl.
*G06F 7/00* (2006.01)
*H01L 21/67* (2006.01)
*H01L 21/683* (2006.01)
*H01L 21/687* (2006.01)

(52) U.S. Cl.
CPC .... *H01L 21/67242* (2013.01); *H01L 21/67288* (2013.01); *H01L 21/6838* (2013.01); *H01L 21/68707* (2013.01)

(58) Field of Classification Search
USPC ......................................... 700/213
See application file for complete search history.

(56) References Cited

U.S. PATENT DOCUMENTS 5,141,201 A * 8/1992 Mizuno .................. F16F 9/532
248/550
6,298,282 B1 * 10/2001 Guldi .................... B25J 9/1674
340/3.3

(Continued)

*Primary Examiner* — Kyle Logan

(57) ABSTRACT

A transporting device for transporting substrate of liquid crystal display and using method thereof are provided. The transporting device comprises a fixing arm, at least two forks mounted on the fixing arm, laser emitting devices respectively mounted on the forks that are used to carry two ends of the substrate, laser sensors mounted on the fixing arm and corresponding to the laser emitting devices, a processor mounted on the fixing arm and connected to the laser sensors, and air damping devices mounted below the forks that are used to carry two ends of the substrate. The droop amount and the vibration of the fork can be measured when the transporting device is carrying a substrate, and it can be determined whether the droop amount and the vibration are abnormal. If they are abnormal, the laser emitting device will be started up to alleviate the vibration of the fork.

5 Claims, 3 Drawing Sheets

(56) References Cited

U.S. PATENT DOCUMENTS

| | | | |
|---|---|---|---|
| 2008/0118338 A1* | 5/2008 | Huang | B25J 9/1692 414/744.3 |
| 2012/0224945 A1* | 9/2012 | Douki et al. | 414/758 |
| 2013/0202388 A1* | 8/2013 | Hayashi | H01L 21/677 414/222.02 |

* cited by examiner

TRANSPORTING DEVICE FOR SUBSTRATE OF LIQUID CRYSTAL DISPLAY AND USING METHOD THEREOF

FIELD OF THE INVENTION

The present invention relates to the field of manufacturing technology for liquid crystal display, and more particularly, relates to a transporting device for substrate of liquid crystal display and using method thereof.

BACKGROUND OF THE INVENTION

Different devices and different circumstances are required during different manufacturing sub-processes for a substrate, and the substrate should be transported several times in the whole manufacturing process. A robot hand often acts as a transporting device in the present transporting process. The liquid crystal panel is supported on the forks of the robot hand when it is transported. The mounting structure of the forks is similar with a hanging structure. However, the substrate is generally made from glass, and is easy to be damaged or shattered due to the vibration of the forks during the transporting. The vibration of the forks is hard to be measured, and more difficult to be monitored real-timely. Only if a large numbers of substrates are broken during the transporting, the operators may be drawn attention to adjust the transporting device. In this case, a great deal of time, manpower, material and money may haven been consumed before the adjustment, and thus making great influence to the capacity of the substrate.

SUMMARY OF THE INVENTION

The object of the present invention is to provide a transporting device for substrate of liquid crystal display and using method thereof, which is able to monitor the vibration of the fork, aiming at the drawbacks that the vibration of the fork in the transporting device is difficult to be measured and monitored in the prior art.

The technical schemes to solve the above technical problems are as follows:

a transporting device for transporting substrate of liquid crystal display is provided, which comprises a fixing arm and at least two forks mounted on the fixing arm; the transporting device further comprises laser emitting devices which are respectively mounted on the forks that carries two ends of the substrate, laser sensors which are mounted on the fixing arm and corresponding to the laser emitting devices, a processor which is mounted on the fixing arm and connected to the laser sensors and air damping devices which are mounted below the forks that carries two ends of the substrate;

when the fork carries the substrate, the laser sensor will receive the laser emitted from the laser emitting device, sense the displacement of the fork via the laser and generate a corresponding sensing signal; the processor will process the sensing signal acquired by the laser sensor, attain a first amplitude of the fork when it carries the substrate, and compare the first amplitude with a first preset threshold; the processor will control the air damping device to work to alleviate the vibration of the fork if the first amplitude is larger than the first threshold.

In the transporting device of the present invention, each of the laser emitting devices is mounted on the outer side of one end of the corresponding fork which is away from the fixing arm.

In the transporting device of the present invention, the laser sensor is a CCD laser displacement sensor, and the number of the laser sensors is the same with that of the laser emitting devices; each of the laser sensors is mounted on a position of the fixing arm, while the position is adjacent to the end where the corresponding fork is connected to the fixing arm; the laser sensors are aligned with the laser emitting devices one to one.

In the transporting device of the present invention, each of the air damping devices is mounted on one end of the corresponding fork which is away from the fixing arm.

In the transporting device of the present invention, each of the air damping devices comprises a air source, an electromagnetic valve which is connected to the air source and controlled to operate by the processor, and an injector head which is connected to the electromagnetic valve; wherein the injector head is mounted on one end of the corresponding fork which is away from the fixing arm.

In the transporting device of the present invention, the transporting device further comprises an alarming device connected to the processor; the processor will control the alarming device to alarm if the first amplitude is larger than the first threshold.

In the transporting device of the present invention, when the fork is not carrying the substrate, the laser sensor will receive the laser emitted from the laser emitting device, sense the displacement of the fork via the laser and generate a corresponding sensing signal; the processor will process the sensing signal acquired by the laser sensor, attain a second amplitude of the fork when it is not carrying the substrate, and compare the second amplitude with a second preset threshold; the processor will control the alarming device to alarm if the second amplitude is larger than the second threshold.

According to the transporting device, a method for transporting a substrate of liquid crystal display is also provided, comprising following steps:

inserting forks below the substrate to be transported so as to support the substrate on the forks;

moving the transporting device to transport the substrate to a designated spot; in the transporting process, the laser sensor receives the laser emitted from the laser emitting device, senses the displacement of the fork via the laser and generates a corresponding sensing signal; the processor processes the sensing signal acquired by the laser sensor, attains a first amplitude of the fork when it is carrying the substrate, and compares the first amplitude with a first preset threshold; the processor will control the air damping device to work to alleviate the vibration of the fork if the first amplitude is larger than the first threshold.

In the method for transporting substrate in the present invention, the transporting device further comprises an alarming device connected to the processor; the processor will control the alarming device to alarm if the first amplitude is larger than the first threshold.

In the method for transporting substrate in the present invention, further comprising following steps:

before inserting the forks below the substrate to be transported, the laser sensor receives the laser emitted from the laser emitting device, senses the displacement of the fork via the laser and generates a corresponding sensing signal; the processor processes the sensing signal acquired by the laser sensor, attains a second amplitude of the fork when it is not carrying the substrate, and compares the second amplitude with a second preset threshold; the processor will control the alarming device to alarm if the second amplitude is larger than the second threshold.

The following beneficial effects will be achieved when implementing the embodiments of the present invention: the transporting device comprises structures including laser emitting devices, laser sensors, a processor, air damping devices and an alarming device. When the transporting device is idling, the droop amount and the vibration of the fork can be measured, and it can be determined whether the droop amount and the vibration are abnormal. If abnormality, the alarming device will alarm. Moreover, when the transporting device carries the substrate, the droop amount and the vibration of the fork can be measured, and it can be determined whether the droop amount and the vibration are abnormal. If abnormality, the laser emitting device will be started up and the alarming device will alarm; more over, if the vibration of the fork is abnormal when the transporting device carries the substrate, the normal manufacturing and operating process will not be affected since the vibration of the fork can be alleviated when the laser emitting device is started up.

BRIEF DESCRIPTION OF THE DRAWINGS

The present invention will be further described with reference to the accompanying drawings and embodiments in the following, in the accompanying drawings.

DETAILED DESCRIPTION OF THE PREFERRED EMBODIMENT

Figure 1:
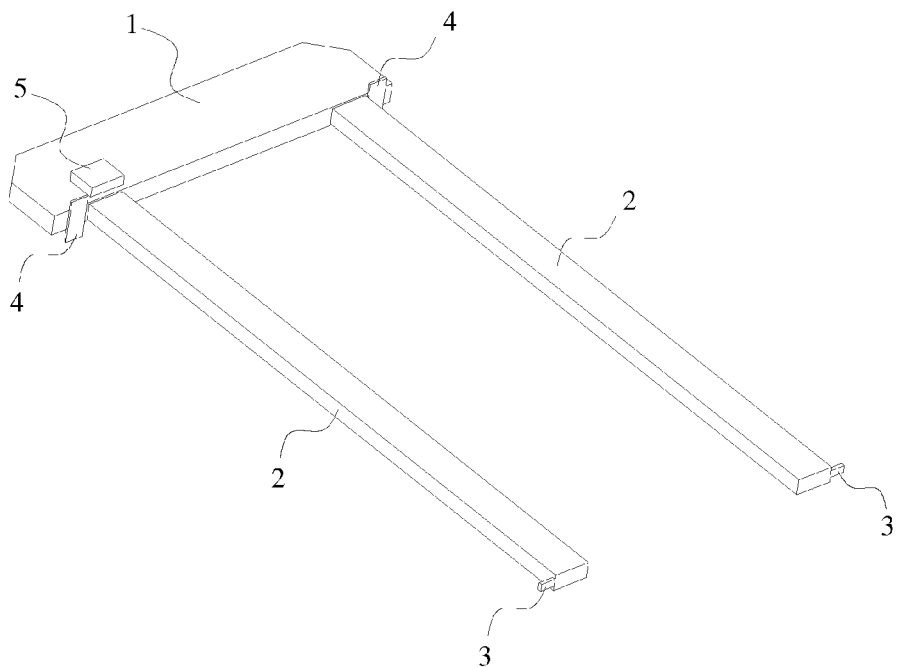
FIG. 1 is a three-dimensional structural diagram for a transporting device according to a preferred embodiment of the present invention.
Figure 2:
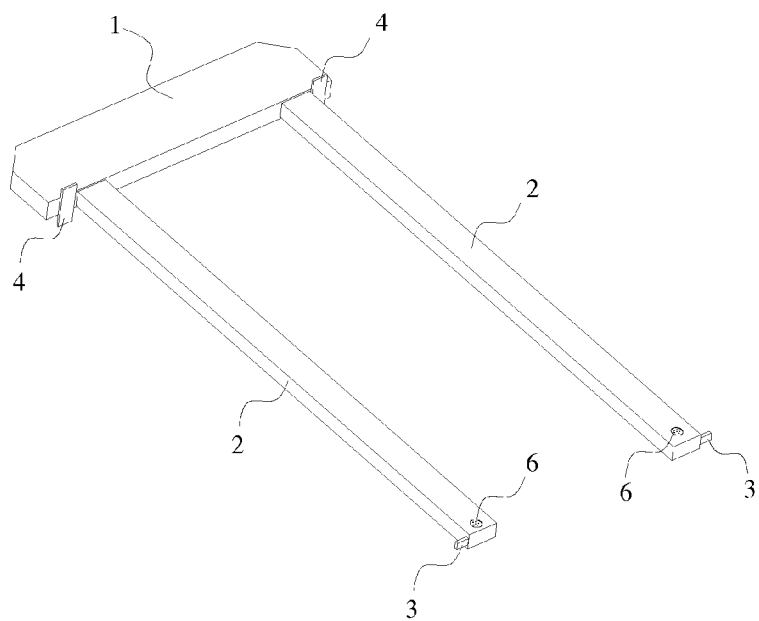
FIG. 2 is another three-dimensional structural diagram for the transporting device shown in FIG. 1.
Figure 3:
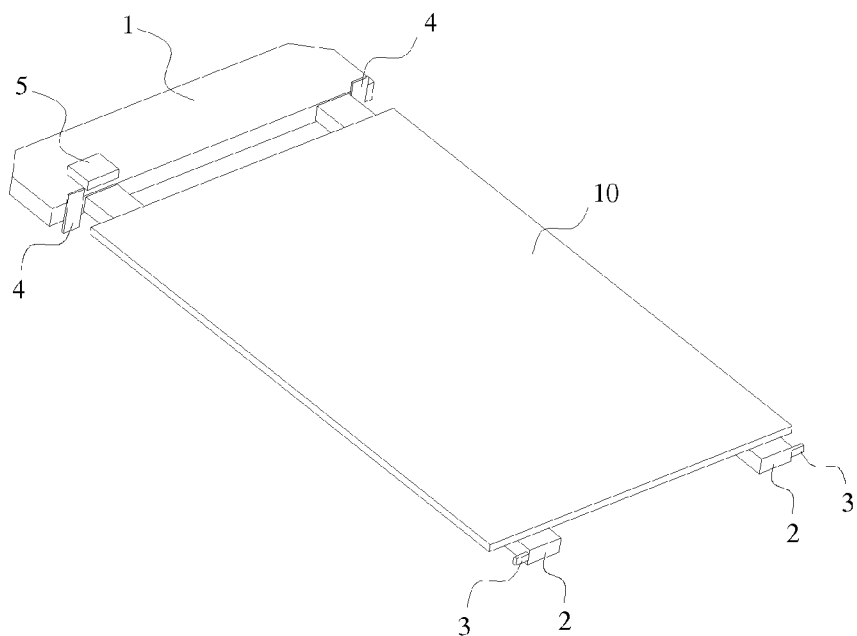
FIG. 3 is a three-dimensional structural diagram for the transporting device shown in FIG. 1 when carrying the substrate.

To make the technical features, objects and effects more clearly, the present invention may be further described in detail with reference to the accompanying drawings and embodiments Referring to FIGS. 1, 2 and 3, a transporting device is provided in a preferred embodiment of the present invention, which is used to transport substrate of liquid crystal display. The transporting device comprises a fixing arm 1, forks 2, laser emitting devices 3, laser sensors 4, a processor 5 and air damping devices 6. The fixing arm 1 is mounted on the driving structure of the transporting device. The fork 2 is substantially board-shaped and used to carry the substrate 10. There are at least two forks 2, and they are mounted on the fixing arm 1 respectively. In the embodiment, there are two forks 2, and the two forks 2 are mounted on two ends of the fixing arm 1 correspondingly. It should be understood that there are other options for the number of the fork 2, such as four forks, and all the forks 2 are mounted on one side of the fixing arm 1 evenly.

The laser emitting device 3 is used to emit laser. There are two laser emitting devices 3, and they are correspondingly mounted on the forks 2 that carries two sides of the substrate 10. It should be understood that displacement may be generated for the laser emitting device 3 with the vibration of the fork 2. The laser sensors 4 are mounted on the fixing arm 1 and corresponding to the positions of the laser emitting devices 3. The laser sensor 4 can receive the laser emitted from the laser emitting device 3, sense the displacement of the fork 2 via the laser and generate a corresponding sensing signal. The processor 5 is mounted on the fixing arm 1 and connected to the laser sensors 4. The processor 5 can process the sensing signal acquired by the laser sensor 4 and attain the amplitude of the fork during vibrating. There are two air damping devices 6 as well, the air damping devices 6 are mounted below the forks 2 that carry two sides of the substrate 10, namely, an air damping device 6 is provided below each fork 2 while the two forks carry two sides of the substrate respectively. When the air damping device 6 is working, it can eject gas downward to alleviate the vibration of the fork 2, and thus keeping the vibration of the fork 2 in a small range.

Figure 5:
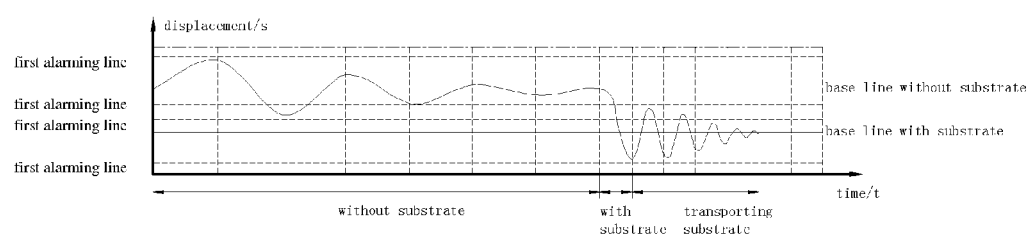
FIG. 5 is a diagram shows the vibration of the fork in the transporting device shown in FIG. 1 during the whole process of transporting the substrate.

In the process of transporting the substrate 10 by the transporting device, namely when the forks 2 carries the substrate 10, the laser emitting device 3 will vibrate with the vibration of the forks 2. Meanwhile, the laser sensor 4 will receive the laser emitted from the laser emitting device 3, sense the displacement of the fork 2 via the laser and generate a corresponding sensing signal. The processor 5 will process the sensing signal acquired by the laser sensor 4, and attain a first amplitude of the fork 2 when it carries the substrate. The vibration of the fork 2 when it carries the substrate is shown in FIG. 5. Referring to FIG. 5, two first alarming lines are preset, and the distances between the base line with substrate and each of the two first alarming lines are equal; Wherein the base line with substrate represents the static state of the fork 2 when it is carrying the substrate 10. The first amplitude is the moving distance of a position where the laser emitting device 3 is mounted on the fork 2 in the vibration when the fork 2 is carrying the substrate 10. The first amplitude may represent the droop amount and the vibration of the fork 2 when it is carrying the substrate 10. Then, the processor 5 may compare the first amplitude with a first preset threshold. The first threshold is the distance between the first alarming line and the base line with substrate. The processor 5 will control the air damping device 6 to work if the first amplitude is larger than the first threshold. In the case, the air damping device 6 will eject gas downward to alleviate the vibration of the fork 2 to keep the fork 2 vibrating within a small range, and thus ensuring the fork 2 operating with a little amount of vibration continuously when the device can't be stopped to be repaired in a busy period. It should be understood that the processor 5 can be defined to start up the air damping device 6 only if it has detected that the fork 2 is moving downward, because the carried substrate 10 may be fallen only if the fork 2 is moving downward.

Specifically, each of the laser emitting devices 3 is mounted on the outer side of one end of the corresponding fork 2 which end is away from the fixing arm 1, and the outer side is a position that has the maximum amplitude on the fork 2.

The laser sensor 4 is a CCD laser displacement sensor which has a high speed and a high accuracy, and the CCD laser displacement sensor can detect the laser signal emitted from the laser emitting device 3 quickly and accurately. The number of the laser sensor 4 is the same with that of the laser emitting device 3. the laser sensors 4 are mounted on a position of the fixing arm 1 respectively, while the position is adjacent to the end where the corresponding fork 2 is connected to the fixing arm 1, and the laser sensors 4 are aligned with the laser emitting devices 3 one to one.

Advantageously, each of the air damping devices 6 is mounted on one end of the corresponding fork 2 which end is away from the fixing arm 1. According to the lever principle, the effect for alleviating the vibration of the forks 2 will be much more obvious when ejecting the same gas if the air damping devices are mounted on the above position. It should be understood that, compared to being mounted on other positions of the fork 2, the air damping device 6 can eject a smaller amount of gas downward to keep the fork 2 vibrating within a small range.

Figure 4:
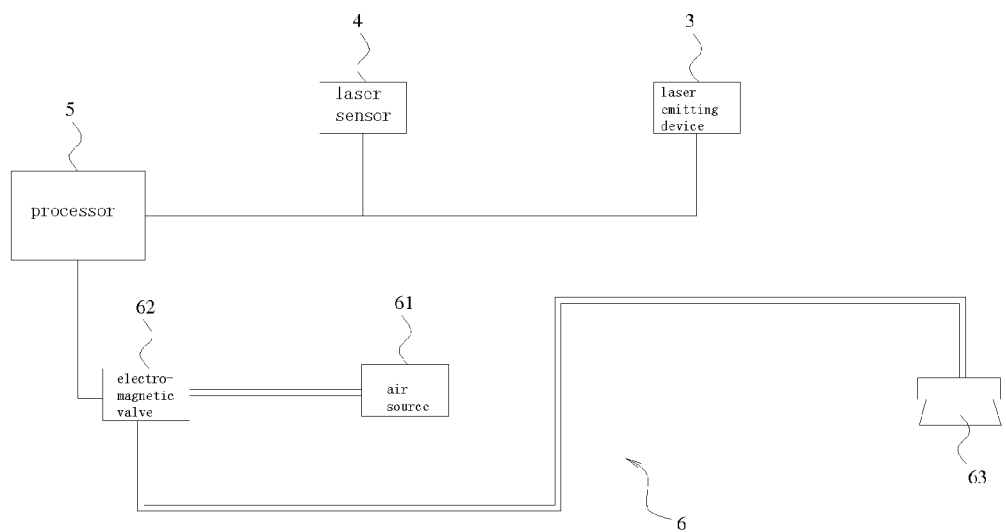
FIG. 4 is a functional scheme for reducing the vibration of the fork in the transporting device shown in FIG. 1.

Referring to FIG. 4, in the embodiment, each of the air damping devices 6 comprises a air source 61, an electromagnetic valve 62 and an injector head 63. The air source may be the compressed gas, which can produce an intensive recoil force. The electromagnetic valve 62 is connected to the processor 5, and the electromagnetic valve 62 is connected between the air source 61 and the injector head 63 to control the opening and closing of the air source 61. The processor 5 can control the operation of the electromagnetic valve 62. The injector head 63 is mounted on one end of the corresponding fork 2 which end is away from the fixing arm 1. The compressed gas is ejected downward by the injector head 63 to drive the fork 2 to rise up, so as to alleviate the vibration on one hand and prevent the substrate 10 falling from the fork 2 on the other hand.

In the embodiment, the transporting device further comprises an alarming device connected to the processor 5 and operated by driving of the processor 5. The alarming device may be a buzzer or a indicating lamp. It should be understood that the alarming device will not be limited to above structures.

Referring to FIG. 5, when the fork 2 is not carrying the substrate 10, namely the fork 2 is idle, the droop amount of the fork 2 can be found out from the figure and the displacement of the fork 2 during the vibration can be monitored. The processor 5 processes the sensing signal acquired by the laser sensor 4, and attains a second amplitude of the fork 2 when the fork 2 is idle. The vibration of the fork 2 when it is idle is also shown in FIG. 5. Referring to FIG. 5, two second alarming lines are preset, and the distances between the base line without substrate and each of the two second alarming lines are equal. Wherein, the base line without substrate represents the static state of the fork 2 when it is idle. The second amplitude is the moving distance of a position where the laser emitting device 3 is mounted on the fork 2 in the vibration when the fork 2 is idle. The second amplitude may represent the droop amount and the vibration of the fork 2 when it is idle. Then, the processor 5 may compare the second amplitude with a second preset threshold. The second threshold is the distance between the second alarming line and the base line without substrate. The processor 5 will control the alarming device to alarm if the second amplitude is larger than the second threshold, so as to indicate the workers that the transporting device is in an abnormal state and it needs to be repaired in time.

When the fork 2 is carrying the substrate 10, the droop amount of the fork 2 can be found out from the FIG. 5 and the displacement of the fork 2 in the vibration can be monitored. The processor 5 will control the alarming device to alarm if the first amplitude is larger than the first threshold, so as to indicate the workers that the transporting device is in an abnormal state and it needs to be repaired in time.

The method for transporting the substrate of liquid crystal display using the above transporting device is as follows:

firstly, inserting the fork 2 below the substrate 10 to be transported so as to support the substrate 10 on the fork 2;

secondly, moving the transporting device to transport the substrate 10 to a designated spot; in the transporting process, the laser sensor 4 receives the laser emitted from the laser emitting device 3, senses the displacement of the fork 2 via the laser and generates a corresponding sensing signal; the processor 5 processes the sensing signal acquired by the laser sensor 4, attains a first amplitude of the fork 2 when it is carrying the substrate 10, and compares the first amplitude with a first preset threshold; the processor 5 will control the air damping device 6 to work to alleviate the vibration of the fork 2 if the first amplitude is larger than the first threshold.

The transporting device further comprises an alarming device connected to the processor 5; the processor 5 will control the alarming device to alarm if the first amplitude is larger than the first threshold, so as to indicate the workers that the transporting device is in a abnormal state.

In the embodiment, the method for transporting further comprises following steps: the laser sensor 4 receives the laser emitted from the laser emitting device 3, senses the displacement of the fork 2 via the laser and generates a corresponding sensing signal; the processor 5 processes the sensing signal acquired by the laser sensor 4, attains a second amplitude of the fork 2 when it is not carrying the substrate 10, and compares the second amplitude with a second preset threshold; the processor 5 will control the alarming device to alarm if the second amplitude is larger than the second threshold, so as to indicate the workers that the transporting device is in a abnormal state and needs to be repaired in time.

While the embodiments of the present invention have been described with reference to the drawings, the present invention will not be limited to above embodiments that are illustrative but not limitative. It will be understood by those skilled in the art that various changes and equivalents may be substituted in the light of the present invention without departing from the scope of the present invention, and those various changes and equivalents shall fall into the protection of the invention.

The invention claimed is:

1. A transporting device for transporting a substrate of a liquid crystal display, comprising
   a fixing arm,
   at least two forks mounted on the fixing arm and configured to carry the substrate,
   two laser emitting devices which are respectively mounted on two outside most forks of the at least two forks,
   two laser sensors which are mounted on the fixing arm and corresponding to the laser emitting devices,
   a processor which is mounted on the fixing arm and connected to the laser sensors, and
   two air damping devices which are mounted below the two outside most forks respectively;
   wherein each of the air damping devices is mounted on one end of a corresponding fork, away from the fixing arm; and each of the air damping devices comprises an air source, an electromagnetic valve which is connected to the air source and controlled to operate by the processor, and an injector head which is connected to the electromagnetic valve; the injector head is mounted on one end of the corresponding fork, away from the fixing arm;
   wherein, when the at least two forks carry the substrate, the laser sensors receive lasers emitted from the laser emitting devices, sense displacement of the at least two forks via the lasers and generate a corresponding sensing signal; the processor processes the sensing signal generated by the laser sensors, attains a first amplitude of the at least two forks when they carry the substrate, and compares the first amplitude with a first preset threshold; the processor will control the air damping devices to work to alleviate vibration of the at least two forks if the first amplitude is larger than the first threshold;
   wherein the processor is defined to start up the air damping device only if it has detected that the at least two forks are moving downward.

2. The transporting device according to claim 1, wherein each of the laser emitting devices is mounted on the outer side of one end of a corresponding fork, away from the fixing arm.

3. The transporting device according to claim 1, wherein the laser sensor is a CCD laser displacement sensor, and the number of the laser sensors is the same as that of the laser emitting devices; each of the laser sensors is mounted on a position of the fixing arm, while the position is adjacent to the end where the two outside most forks are connected to the fixing arm; the laser sensors are aligned with the laser emitting devices one to one.

4. The transporting device according to claim 1, wherein the transporting device further comprises an alarming device connected to the processor; the processor will control the alarming device to alarm if the first amplitude is larger than the first threshold.

5. The transporting device according to claim 4, wherein when the at least two forks are not carrying the substrate, the laser sensors receive the lasers emitted from the laser emitting devices, sense the displacement of the at least two forks via the lasers and generate a second corresponding sensing signal; the processor processes the second sensing signal generated by the laser sensors, attain a second amplitude of the at least two forks when they are not carrying the substrate, and compare the second amplitude with a second preset threshold; the processor will control the alarming device to alarm if the second amplitude is larger than the second threshold.

* * * * *